United States Patent [19]
Zakhor et al.

[11] Patent Number: 5,089,778
[45] Date of Patent: Feb. 18, 1992

[54] METHOD OF CANCELLING GHOSTS FROM NMR IMAGES

[75] Inventors: Avideh Zakhor, Encino, Calif.; Richard R. Rzedzian, Lexington, Mass.

[73] Assignee: Advanced NMR Systems, Inc., Woburn, Mass.

[21] Appl. No.: 390,075

[22] Filed: Aug. 7, 1989

[51] Int. Cl.⁵ ............................................. G01R 33/20
[52] U.S. Cl. .................................................. 324/312
[58] Field of Search ...................... 324/309, 312, 306; 364/413.13; 128/653 A, 653 AF

[56] References Cited

U.S. PATENT DOCUMENTS 4,720,678 1/1988 Glover et al. ...................... 324/312

Primary Examiner—Michael J. Tokar
Assistant Examiner—Kevin D. O'Shea
Attorney, Agent, or Firm—Ostrolenk, Faber, Gerb & Soffen

[57] ABSTRACT

A method of cancelling ghosts from NMR images. The method involves estimating a phase difference function $\Delta(n_1, n_2)$ and using that function to solve a linear system of equations to find the magnitudes of the true object densities at the true image and ghost locations $x(n_1,n_2)$ and $x(n_1,n_2+N/2)$, respectively, where the image has dimensions $N \times N_s$. Experimental values of $\Delta(n_1, n_2)$ for a variety of objects indicate that its variation along $n_1$ is considerably larger than along $n_2$. Thus, for each column $n_1$, the phase difference function $\Delta(n_1, n_2)$ can be modelled as a one-dimensional function of $n_2$ with two parameters $\alpha(n_1)$ and $\beta(n_1)$, which are estimated from the pixels in the 2-D FFT processed reconstructed image $Y(n_1,n_2)$. These parameters are then used to estimate $\Delta(n_1, n_2)$, which is ultimately used to deghost the image.

6 Claims, 6 Drawing Sheets

METHOD OF CANCELLING GHOSTS FROM NMR IMAGES

BACKGROUND OF THE INVENTION

The present invention relates to a method for improving reconstructed NMR images and, more specifically, to a method for cancelling ghosts from NMR images.

Under ideal conditions, reconstructed NMR images must be positive and real. This is because, in NMR experiments, the observed signal is Fourier transform of density distribution of the object under consideration, which by definition is a real positive quantity. In practice however, even the most straightforward ways of scanning the $k_x$-$k_y$ space, (e.g., row by row or column by column scanning without date reversal), result in complex images. This is partly due to a shift in the data from the notional origin in k space. If readout gradient is constant and uniform time samples of data are inverse Fourier transformed to generate the image, delay in the time data translates into a linear phase shift in the reconstructed image. These phase shifts can be easily determined and eliminated, since they do not affect the magnitude of the reconstructed images.

When NMR data is obtained by scanning the $k_x$-$k_y$ space, with data reversal on alternate y lines (where y is the horizontal axis across which readout occurs), time delays between the start of data acquisition and the start of the readout pulse are different for even and odd lines. The effect of this on the image manifests itself as a ghost separated by half the image size. Under these conditions, if readout gradient is constant and data is sampled uniformly in time, then the ghost image can be entirely removed by a first-order phase difference between odd and even lines. However, when the readout gradient is sinusoidal and the image is reconstructed by inverse Fourier transforming non-uniform samples (see, e.g., the method disclosed in U.S. Pat. No. 4,740,748) the difference between even and odd line delays degrades introduces ghosts and thus the quality of the resolution.

This, together with asymmetry of the sinusoidal readout gradient for even and odd lines can be modeled by multiplying even and odd parts of the NMR image by two separate phase functions $\phi(n_1,n_2)$ and $\theta(n_1,n_2)$. More specifically, if $x(n_1,n_2)$ denotes the true density distribution of the object under consideration, and $Y(n_1,n_2)$ denotes the 2-D inverse discrete Fourier transform of the time data (i.e., the reconstructed ghosted image), then the even and odd parts of the observed image, $Y_{even}(n_1,n_2)$ and $Y_{odd}(n_1,n_2)$ can be modeled as:

$$Y_{even}(n_1, n_2) = Y(n_1, n_2) + Y\left(n_1, n_2 + \frac{N}{2}\right) \quad (1)$$

$$= x(n_1, n_2)e^{j\phi(n_1,n_2)} + x\left(n_1, n_2 + \frac{N}{2}\right)e^{j\phi(n_1,n_2+\frac{N}{2})}$$

$$0 \leq n_1 < N_s, \; 0 \leq n_2 < \frac{N}{2}$$

$$Y_{odd}(n_1, n_2) = Y(n_1, n_2) - Y\left(n_1, n_2 + \frac{N}{2}\right) \quad (2)$$

$$= x(n_1, n_2)e^{j\theta(n_1,n_2)} - x\left(n_1, n_2 + \frac{N}{2}\right)e^{j\theta(n_1,n_2+\frac{N}{2})}$$

$$0 \leq n_1 < N_s, \; 0 \leq n_2 < \frac{N}{2}$$

where the dimensions of the reconstructed image are $N \times N_s$, and the number of echoes is N. (Note that if the sinusoidal readout y gradient was identical for even and odd lines, then the even and odd phase functions would have been identical. That is, $\phi(n_1,n_2) = \theta(n_1,n_2)$).

Having modeled the ghosted image, the objective can be stated as estimation of the true object density distribution $x(n_1,n_2)$ from the observed ghosted image $Y(n_1,n_2)$.

From equations (1) and (2), it is clear that if the phase functions $\phi(n_1,n_2)$ and $\theta(n_1,n_2)$ are known for all values of $n_1$ and $n_2$, then $x(n_1,n_2)$ and $x(n_1,n_2+N/2)$ can be determined from $Y_{even}(n_1,n_2)$ $Y_{odd}(n_1,n_2)$ by solving a 2×2 linear system of equations. In practice, the difference between $\phi(n_1,n_2)$ and $\theta(n_1,n_2)$ can be determined experimentally by placing a test object in the upper and lower half of the field of view (FOV) and measuring the difference between even and odd parts of the resulting images. More specifically, when the object is in the upper half of the FOV, by definition:

$$x(n_1, n_2 + N/2) = 0$$

Substituting this into equations (1) and (2):

$$Y_{even}(n_1, n_2) = x(n_1, n_2)e^{j\phi(n_1,n_2)} \quad (3)$$

$$0 \leq n_1 < N_s, \; 0 \leq n_2 < \frac{N}{2}$$

$$Y_{odd}(n_1, n_2) = x(n_1, n_2)e^{j\theta(n_1,n_2)} \quad (4)$$

$$0 \leq n_1 < N_s, \; 0 \leq n_2 < \frac{N}{2}$$

The phase difference between $Y_{even}(n_1,n_2)$ $Y_{odd}(n_1,n_2)$ can be used to obtain $$\Delta(n_1, n_2) = \phi(n_1, n_2) - \theta(n_1, n_2) \quad (5)$$

$$= \text{phase}(Y_{even}(n_1, n_2)) - \text{phase}(Y_{odd}(n_1, n_2))$$

$$0 \leq n_1 < N_s, \; 0 \leq n_2 < \frac{N}{2}$$

Similarly, by placing the object in the lower half of the FOV:

$$x(n_1, n_2) = 0$$

$$Y_{even}(n_1, n_2) = x\left(n_1, n_2 + \frac{N}{2}\right)e^{j\phi(n_1,n_2+\frac{N}{2})} \quad (6)$$

$$0 \leq n_1 < N_s, \; 0 \leq n_2 < \frac{N}{2}$$

$$Y_{odd}(n_1, n_2) = -x\left(n_1, n_2 + \frac{N}{2}\right)e^{j\theta(n_1,n_2+\frac{N}{2})} \quad (7)$$

$$0 \leq n_1 < N_s, \; 0 \leq n_2 < \frac{N}{2}$$

The phase difference between $Y_{even}(n_1,n_2)$ and $Y_{odd}(n_1,n_2)$ can be used to obtain $$\Delta\left(n_1, n_2 + \frac{N}{2}\right) = \phi\left(n_1, n_2 + \frac{N}{2}\right) - \theta\left(n_1, n_2 + \frac{N}{2}\right) \quad (8)$$
$$= \text{phase}(Y_{even}(n_1, n_2)) -$$
$$\text{phase}(Y_{odd}(n_1, n_2)) + \pi$$

$$0 \leq n_1 < N_s \quad 0 \leq n_2 < \frac{N}{2}$$

Letting $$A(n_1, n_2) = x(n_1, n_2)e^{j\theta(n_1,n_2)} \quad (9)$$

$$B(n_1, n_2) = x\left(n_1, n_2 + \frac{N}{2}\right)e^{j\theta(n_1,n_2+\frac{N}{2})} \quad (10)$$

in equations (1) and (2):

$$Y_{even}(n_1, n_2) = A(n_1, n_2)e^{j\Delta(n_1,n_2)} + B(n_1, n_2)e^{j\Delta(n_1,n_2+\frac{N}{2})} \quad (11)$$

$$Y_{odd}(n_1, n_2) = A(n_1, n_2) - B(n_1, n_2)$$

Thus, experimental values of $\Delta$ ($n_1$,$n_2$) and $\Delta$ ($n_1$,$n_2$+N/2) can be used to determine A($n_1$,$n_2$) and B($n_1$,$n_2$) by solving the above linear system of equations. Once A and B are determined, their magnitudes can be used to find x($n_1$,$n_2$) and ($n_1$,$n_2$+N/2) respectively.

Experimentally, there are two major drawbacks with the above approach. The first drawback has to do with the fact that the phase difference function is a function of the parameters for the NMR experiments. Some of these parameters are the strength of the x, y and z gradients, and the static magnetic field or the RF. Therefore, to be able to apply this method successfully, a different look up table is needed for different experimental set ups. The second drawback has to do with the fact that the phase difference function $\Delta$ ($n_1$,$n_2$) is somewhat object dependent. More specifically, although the general shape of $\Delta$ ($n_1$,$n_2$) does not vary drastically from one object to the next, the change is large enough to introduce considerable amount of ghosts. The third drawback of the above approach has to do with the fact that obtaining the phase difference function $\Delta$ ($n_1$,$n_2$) of a test object for all values of $n_1$ and $n_2$ is a non-trivial task from an experimental point of view. This has to do with factors such as susceptibility effects.

In short, it has been found that the performance of the above scheme is inadequate for most ghosted images. Accordingly, it would be highly desirable to process NMR signals using a method of ghost correction in the form of an algorithm which is automatic and does not require a look up table.

SUMMARY OF THE INVENTION

The object of the present invention is therefore to provide a method for automatically eliminating ghosts in NMR signals resulting from the difference between even and odd line delays in a traversal of k-space using a sinusoidal readout gradient without using a look-up table.

The present invention achieves the foregoing objective by a method involving the steps of:

(a) taking a two dimensional inverse Fourier transform of the time data to obtain the ghosted image Y($n_1$,$n_2$);

(b) computing the signal energy for each column using $$E(n_1) = \sum_{n_2=0}^{N-1} |Y(n_1, n_2)|^2$$

(c) discarding the columns whose signal energy level are below a predetermined threshold;

(d) estimating $\alpha$ ($n_1$) and $\beta$ ($n_1$) for each remaining column of data; i.e. $n_1$=0, ... $N_s$-1, by:

(i) finding the phase difference function $\Delta$ ($n_1$,$n_2$) for all ghosting pixels of the column; and (ii) solving the following simultaneous equations to find linear least square estimates of $\alpha$ ($n_1$) and $\beta$ ($n_1$):

$$\Delta(n_1, n_2) = \begin{cases} \alpha(n_1) + \beta(n_1)n_2 & 0 \leq n_2 \leq \frac{N}{2} \\ \alpha(n_1) + \beta(n_1)N - \beta(n_1)n_2 & \frac{N}{2} \leq n_2 < N \end{cases} \quad (12)$$

(e) using $\alpha$ ($n_1$) and $\beta$ ($n_1$) in the above equation to find the phase difference $\Delta$ ($n_1$,$n_2$) for $0 \leq n_2 < N$; and (f) using $\Delta$ ($n_1$,$n_2$) in equation (11) to find A($n_1$,$n_2$) and B($n_1$,$n_2$) for $0 \leq n_2 < N$.

From equations (9) and (10), the true object density distribution at ($n_1$,$n_2$) and ($n_1$,$n_2$+N/2) are found by taking magnitude of A($n_1$,$n_2$) and B($n_1$,$n_2$), respectively.

BRIEF DESCRIPTION OF THE DRAWINGS

These and other features and advantages of the present invention will become apparent when the following text is read in conjunction with the accompanying drawings, in which.

DETAILED DESCRIPTION OF THE PREFERRED EMBODIMENT

Figure 1:
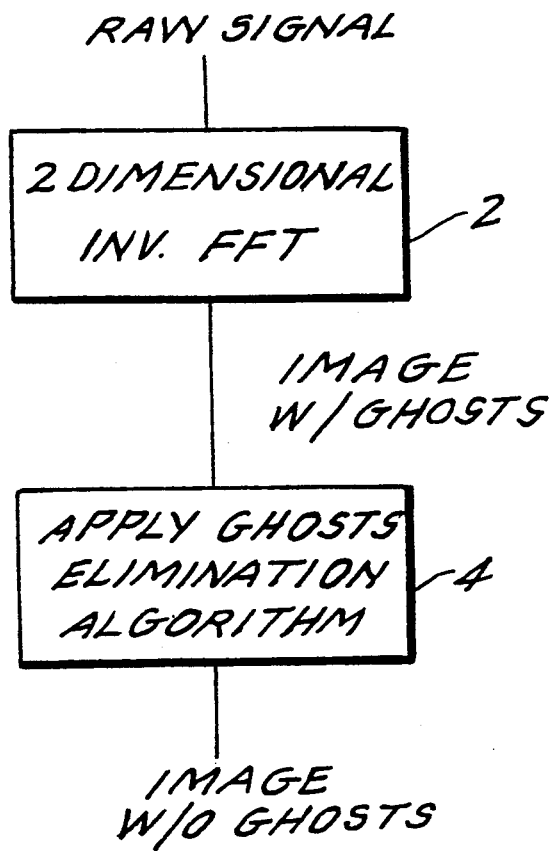
FIG. 1 shows a flow diagram of the ghost correction method of the present invention.

Referring first to FIG. 1, a simplified block diagram of the method of invention is shown. First, the raw NMR signal is converted to an image by performing a two dimensional inverse Fast Fourier Transform (FFT) 2. The resultant image has ghosts, which are eliminated by processing the image with the ghost elimination algorithm 4 of the present invention.

Figure 2:
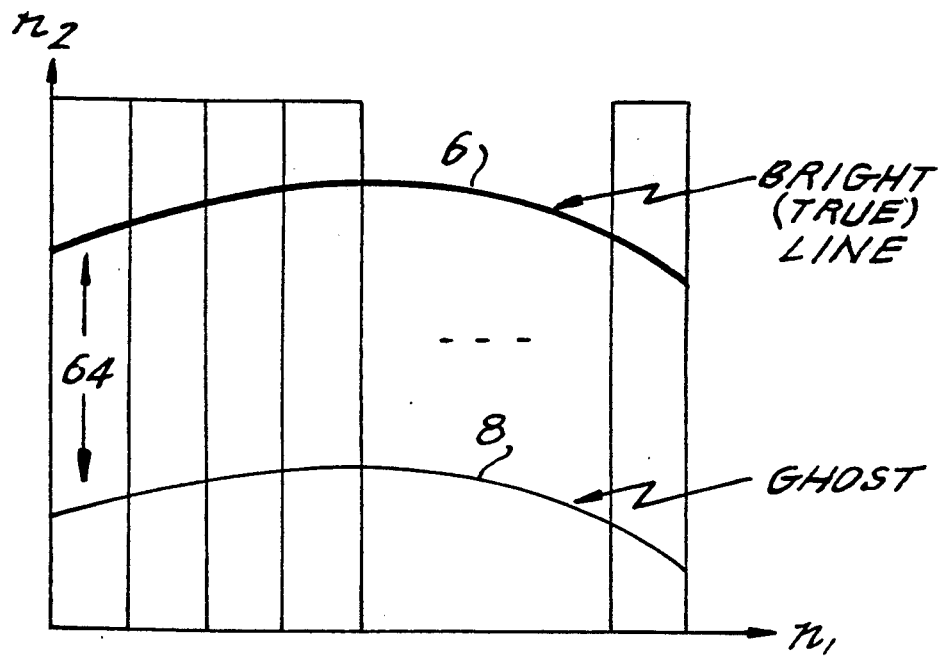
FIG. 2 depicts a reconstructed image with ghosts.

FIG. 2 depicts an image with ghosts. As shown therein, a bright line 6 represents the true image, while a less bright line 8 is a ghost of true image 6. Assuming that the traversal through k-space involves the sampling of 128 lines, the ghost will be separated by the true image by 64 lines, i.e. half the image size.

Figure 3:
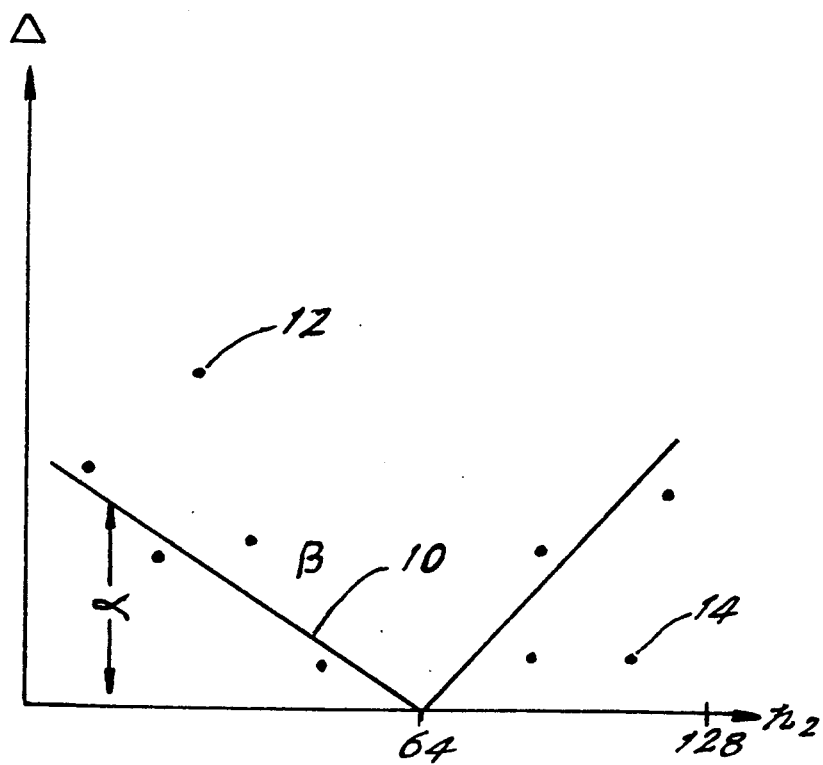
FIG. 3 graphically depicts the phase difference function.

FIG. 3 graphically depicts the phase difference function $\Delta$ ($n_1$,$n_2$). As shown therein, the phase difference function is appropriately symmetrical along the center of the $n_2$ axis. The phase difference function is defined by the offset $\alpha$ and slope $\beta$ of a straight line 10 obtained by taking the least square estimation of a number of points; certain points 12,14 are eliminated (ignored) as being out-of-range since $\Delta(n_1,n_2)$ is assumed to vary smoothly.

The ghost correction algorithm of the present invention takes advantage of the approximate shape of the phase difference function, which as described above, can be obtained experimentally for test objects. Experiments indicate that variation of the function $\Delta(n_1,n_2)$ is considerably smaller along $n_2$ than $n_1$. In fact, for fixed $n_1$, variation along $n_2$ is symmetric about $n_2=N/2$ and $\Delta(n_1,n_2)$ can be closely approximated by a piecewise linear function of the form:

$$\Delta(n_1, n_2) = \begin{cases} \alpha(n_1) + \beta(n_1) n_2 & 0 \leq n_2 \leq \frac{N}{2} \\ \alpha(n_1) + \beta(n_1)N - \beta(n_1) n_2 & \frac{N}{2} \leq n_2 < N \end{cases} \quad (12)$$

The algorithm of the present invention takes advantage of the above approximation by estimating $\alpha(n_1)$ and $\beta(n_1)$ for each column of the data, i.e. $n_1=0, \ldots, N_s-1$. It consists of the following steps:

1. If raw sampled data is input, take 2-D inverse Fourier transform of the time data to obtain the ghosted image $Y(n_1,n_2)$.

2. Determine signal energy for each column of the data by computing $$E(n_1) = \sum_{n_2=0}^{N-1} |Y(n_1, n_2)|^2 \quad (13)$$

3. Discard columns whose signal energy level is below a fixed threshold. This threshold is an input to the program of Appendix (A), and is denoted by the double precision variable "snr".

4. Let S denote the set of indices of the columns whose signal energy level is larger than the threshold snr. Estimate $\alpha(n_1)$ and $\beta(n_1)$ for all $n_1 \in S$. The estimation procedure will be discussed at length later.

5. Use $\alpha(n_1)$ and $\beta(n_1)$ in equation (12) to find $A(n_1,n_2)$ and $B(n_1,n_2)$ for $0 \leq n_2 < N$. From equations (9) and (10), the true object density distribution at $(n_1,n_2)$ and $(n_1,n_2+N/2)$ are found by taking magnitude of $A(n_1,n_2)$ and $B(n_1,n_2)$, respectively.

The algorithm of the present invention has been implemented in "C" programming language, and its listing is included in Appendix (A). The name of the "C" program is "correct.c". The usage of the program is described by simply invoking its executable without any parameters:

usage: correct
-g (if set, will do inverse two-dimensional FFT)
-s (snr: avoid processing columns with small signal component)
-t (ratio between—Y(n1,n2)—and—Y(n1,n2+N/2)—: must be larger for central columns)
-r (even to odd ratio: must be close to 1 for ghosting pixels)
-m (mse$^2$tolerance: discard pixels whose llsq$^3$mse is large)
-h (ghost larger than image: 1 left, 2 right, 3 both)
-d (parameter controlling smoothness of alpha corrections)
-f (parameter controlling smoothness of beta corrections)
-a (scale to see the ghosts clearly)
-e (expand by an integer factor in each direction)
-c (convert to hexadecimal for halftone printout)
inputfile
outputfile As it is seen, the program takes an input file representing the sampled time data or its two-dimensional (2-D) inverse Fourier transform, and generates an output file containing either the binary or hexadecimal version of the ghost-free image. Clearly, the parameters used by the program are set by the operator in such a way that the performance of the algorithm is optimized. Some of these parameters such as "-g", "-c", and "-f" are only used as switches to set flags, while others are used to set internal variables (either integer or floating point) to specific values. An example of the usage of the program is as follows:

correct -g -t100. -r1.5 -s5. -m2. -f -d.7 -b.04 -a750 -e4
inputfile outputfile

In the above example, the internal variable associated with "-t" is 100, the one associated with "-r" is 1.5, etc.

The function of various parameters used in step 1. through step 3. of the algorithm is as follows:

The "-g" flag determines whether or not the input ASCII file is the raw time data or its 2-D inverse Fourier transform. Specifically, if the "-g" option is set, then the program assumes the input file to contain raw time data, and computes the 2-D inverse Fourer transform of the data by successive application of the "ifft05" subroutine. This subroutine takes inverse FFT of one-dimensional sequences, and its listing is included in Appendix (B).

The "-s" option sets the internal double precision variable "snr" used in steps 2. and 3. above. A large number of the columns in the ghosted input image correspond to empty space in the magnet, and therefore have no signal component. To prevent the ghost correction algorithm from processing these columns, the signal energy for each column of the ghosted image is computed and compare it to a fixed threshold. This fixed threshold is the "snr" variable which is set by the "-a" option. The signal energy for the $n_1$th column is defined to be:

$$E(n_1) = \sum_{n_2=0}^{N-1} |Y(n_1, n_2)|^2$$

where $Y(n_1,n_2)$ denotes the value of the ghosted image at location $(n_1,n_2)$. Thus, the AGC algorithm only processes columns whose energies exceed the threshold set by the variable "snr". An appropriate value of "snr" is 5 for input files containing raw time data, and $2 \times 10^8$ for the ones containing the 2-D inverse Fourier transform of the raw time data.

Step 4. of the algorithm is now described in more detail. As set forth in the Background section above, the phase difference function $\Delta(n_1,n_2)$ can be found experimentally by placing a test object in the lower or upper half of the FOV. Specifically, the ghost of a test object at location $(n_1,n_2)$ with $$0 \leq n_2 < \frac{N}{2}$$

appears at $(n_1,n_2+N/2)$, and vice versa. Thus, the location of the ghost of a pixel at $(n_1,n_2)$ is $(n_1,(n_2+N/2) \mod N)$. In general, if an object only fills out half of the FOV, its ghost does not overlap with itself in the reconstructed image. Under these conditions, the phase difference function associated with the object and the particular experimental set up can be determined empirically for regions of the reconstructed image which correspond to the object rather than its ghost. (Two special cases of this were discussed in the Background section. These cases correspond to the object being in the lower or upper half of the FOV). On the other hand, when an object fills out more than half of the FOV, its phase difference function can only be determined for pixels whose ghosts are not superimposed on pixels corresponding to other parts of the object. This information about $\Delta(n_1,n_2)$ can be exploited to find the parameters $\alpha$ and $\beta$ as defined by equation (12). Pixels which correspond to bright (high intensity) parts whose locations correspond to either empty space in the FOV or parts of the object with very little or no energy, will be referred to as "ghosting pixels". Specifically, if the pixel at location $(n_1,n_2)$ is a ghosting one, then by definition:

1. It corresponds to a high energy point in the object. Therefore $$|x(n_1,n_2)| >> 0$$

2. The pixel at location $(n_1,(n_2+N/2) \bmod N)$ corresponds to a low energy part of an object or empty space in the FOV. That is $$|x(n_1,(n_2+N/2) \bmod N)| \approx 0$$

Step 4 of the automatic ghost correction algorithm derives the parameters associated with the $n_1$th column in two steps. Specifically, it first finds the value of the phase difference function for all the "ghosting pixels" of the column, and then solves an overdetermined linear system of equations to find linear least square estimates of $\alpha(n_1)$ and $\beta(n_1)$. At this point, the key question which remains to be answered is the way ghosting pixels are detected. The present invention uses two criteria for classifying pixels as ghosting ones.

The first criterion is a direct consequence of equation (11) and the second part of the definition of ghosting pixels. It takes advantage of the fact that the magnitude of the even and parts of a ghosting pixel at location $(n_1,n_2)$ are identical. Specifically, if $Y(n_1,n_2)$ is a ghosting pixel, from equation (11):

$$|Y_{even}(n_1,n_2)| = |Y_{odd}(n_1,n_2)|$$
$$= |A(n_1,n_2)| = x(n_1,n_2) \quad (14)$$

Thus, if the ratio between the magnitude of even and odd parts of the pixel (the "eoratio") at location $(n_1,n_2)$ are equal or somewhat close to each other, then $Y(n_1,n_2)$ can be classified as a ghosting pixel. In the program listing of the automatic ghost correction algorithm in Appendix (A), if the ratio between the magnitudes of even and odd parts of a pixel are between [1/eoratio, eoratio], then the pixel is classified as a ghosting one. As seen, "eoratio" denotes a double precision variable which is input to the program by the operator via parameter -r. It is important to note that under this criterion, the conditions for $Y(n_1,n_2)$ and $Y(n_1,n_2+N/2)$ to qualify as ghosting pixels are identical Thus, if equation (14) is exactly or approximately satisfied, then there is an ambiguity as to which pixel is the ghosting one. As discussed below, the second criteria for ghosting pixel detection helps to resolve this ambiguity.

The appropriate values of "eoratio" is anywhere between 1 and 2. In most of the examples of the next section, the "-r" option (the internal variable "eoratio") is set to 1.5. If it is set to small values (i.e. too close to 1), then the number of ghosting pixels will be too small, and therefore estimation of $\alpha(n_1)$ and $\beta(n_1)$ will not be robust. On the other hand, if it is set to larger values such as 2 or even 3, then the chosen pixels might not necessarily be the ghosting ones. This will increase the error in the observations for the linear least-squares estimation, and therefore will result in less accurate estimation of $\alpha(n_1)$ and $\beta(n_1)$.

The second criteria takes advantage of the definition of ghosting pixels. To describe this condition, equations (1) and (2) are rewritten in the following way:

$$Y(n_1, n_2) = \frac{1}{2}[Y_{even}(n_1, n_2) + Y_{odd}(n_1, n_2)] \frac{x(n_1, n_2)}{2}[e^{j\phi(n_1,n_2)} + \quad (15)$$

$$e^{j\theta(n_1,n_2)}] + \frac{x\left(n_1, n_2 + \frac{N}{2}\right)}{2}\left[e^{j\phi(n_1,n_2+\frac{N}{2})} - e^{j\theta(n_1,n_2+\frac{N}{2})}\right]$$

$$Y\left(n_1, n_2 + \frac{N}{2}\right) = \frac{1}{2}[Y_{even}(n_1, n_2) - \quad (16)$$

$$Y_{odd}(n_1, n_2)]\frac{x(n_1,n_2)}{2}[e^{j\phi(n_1,n_2)} - e^{j\theta(n_1,n_2)}] +$$

$$\frac{x\left(n_1, n_2 + \frac{N}{2}\right)}{2}\left[e^{j\phi(n_1,n_2+\frac{N}{2})} + e^{j\theta(n_1,n_2+\frac{N}{2})}\right]$$

As expected, if
$\theta(n_1,n_2) = \phi(n_1,n_2)$
or equivalently
$\Delta(n_1,n_2) = 0$ the observed image, $Y(n_1,n_2)$, becomes ghost free and is identical to the true object density function $x(n_1,n_2)$. Recall that if the pixel at location $(n_1,n_2)$ is a ghosting one, then by definition, the magnitude of $x(n_1,n_2)$ must be large (i.e. not at the noise level) and the magnitude of $x(n_1,n_2+N/2)$ must be very small (i.e. not at the noise level). From equations (15) and (16), if the difference between $\theta(n_1,n_2)$ and $\phi(n_1,n_2)$ is small (or equivalently $\Delta(n_1,n_2)$ is small), then a ghosting pixel at $(n_1,n_2)$ results in a large value of the following ratio:

$$\text{Ratio}(n_1, n_2) = \frac{|Y(n_1, n_2)|}{\left|Y\left(n_1, n_2 + \frac{N}{2}\right)\right|} \quad (17)$$

Specifically, as $\Delta(n_1,n_2)$ changes from 0 to $\pi$, the above ratio changes from $\infty$ to 0. It has been found experimentally that $\Delta(n_1,n_2)$ is smaller for columns closer to the center of the magnet (i.e. around $n_1 = N_s/2$). This implies that the ratio of equation (17) becomes larger as the index of the column under investigation becomes closer to $N_s/2$. Thus, the second criterion for detecting ghosting pixels of the $n_1$th column consists of 1. Computing the quantity shown in equation (17) for each pixel.

2. Comparing this ratio to a fixed threshold associated with that column.

Clearly, this threshold is column dependent and becomes larger as the indices of the columns become closer to $N_s/2$. In the program listed in Appendix (A), the threshold for the $n_1$th column is:

the internal variable "threshold" set by "-t" option, if $n_1 = N_s/2$.

decreases linearly with $|n_1 - N_s/2|$ for $|n_1 - N_s/2| < 15$.

is equal to 1 for $|n_1 - N_s/2| > 15$.

In most of the following examples, the "-t" option (the internal double precision "threshold") is set to 100. In general, the appropriate value for the "-t" option depends on the amount of ghosting in the central part of the image, and lies between 1 and 10000. If the reconstructed image suffers from considerable amount of ghosting in the central columns, then "threshold" must be set at a small value e.g. 1. Otherwise, it should be set at a larger value, say 100, so that the center 30 columns of the image remain more or less unchanged by the algorithm. If the central columns of an image are ghost-free, setting the "-t" option at small values might result in unnecessary distortions in these columns.

To summarize, the first ghost detection criterion checks the ratio between the magnitudes of even and odd parts of the pixel at location $(n_1,n_2)$. If this ratio is close to one, then either $Y(n_1,n_2)$ or $Y(n_1,n_2+N/2)$ are classified as ghosting pixels. To resolve this ambiguity and to improve the detection procedure, a second criterion is used which computes the ratio shown in equation (17). For columns close to the center of the magnet, large values of this ratio imply a ghosting pixel at location $(n_1,n_2)$. However, for columns further away from the center, the second criterion becomes more or less inconclusive, and other ways must be found to overcome the ambiguity problem of the first criterion. The present invention uses the apriori knowledge about the approximate shape of the phase difference function in order to resolve this ambiguity. Detailed experimental procedures for obtaining the phase difference function was described in the Background section above. Unlike that "look up" table approach, the present invention does not require detailed and exact values of the phase difference function. In fact, the algorithm of the present invention only needs to know as much about $\Delta(n_1,n_2)$ as to make binary decisions.

From the description of the automatic ghost correction algorithm, it is clear that the ghosting pixel detection part is rather hueristic. To decrease the sensitivity of the algorithm to this part, and to improve the estimation of the phase difference function, the following measures are preferably employed:

From classical results in estimation theory, it is clear that the error in estimating the parameters of $\Delta(n_1,n_2)$, i.e. $\alpha$ and $\beta$, is reduced as the number of observations is increased. In this case, the observations are the empirical value of the phase difference function for the ghosting pixels. Experimental results seem to indicate that for columns whose number of observations (or equivalently the number of ghosting pixels) is small, the error in estimating $\beta$ in equation (12) becomes rather large. This error manifests itself as large magnitude for $\beta$, resulting in unrealistic values of the phase difference function. Since experimental results indicate that the magnitude of $\beta$ is small for most columns, the present invention sets to $\beta=0$ for columns whose number of ghosting pixels is less than a fixed integer. In the program listing of Appendix (A), this integer has been chosen to be 8. To make the estimation part of the algorithm even more robust, $\beta$ is set to zero when the magnitude of its estimated value exceeds a certain threshold. The optimal value for this threshold was found empirically from the approximate shape of the phase difference function for various test objects. For the program listed in Appendix (A), this threshold was set to 0.08.

A second measure taken to improve the robustness of the algorithm is to discard ghosting pixels whose least-square residue is too large. Specifically, if $i_1,i_2,\ldots, i_{upper} < N/2$ and $j_1,j_2,\ldots, j_{lower} \geq N/2$ denote the indices of the ghosting pixels of the $n_1$th column, taking into account equation (12), the linear least-squares estimation of $\alpha$ and $\beta$ consists of solving the following overdetermined linear system of equations:

$$\begin{bmatrix} 1 & i_1 \\ 1 & i_2 \\ \cdot & \cdot \\ \cdot & \cdot \\ \cdot & \cdot \\ 1 & i_{upper} \\ 1 & N-j_1 \\ 1 & N-j_2 \\ \cdot & \cdot \\ \cdot & \cdot \\ \cdot & \cdot \\ 1 & N-j_{lower} \end{bmatrix} \begin{bmatrix} \alpha(n_1) \\ \beta(n_1) \end{bmatrix} = \begin{bmatrix} \Delta(n_1, i_1) \\ \Delta(n_1, i_2) \\ \cdot \\ \Delta(n_1, i_{upper}) \\ \Delta(n_1, j_1) \\ \Delta(n_1, j_2) \\ \cdot \\ \cdot \\ \Delta(n_1, j_{lower}) \end{bmatrix} \quad (18)$$

If $\alpha(n_1)$ and $\beta(n_1)$ denote the solution of the above linear least-squares problem, the residue of the ghosting pixels at $(n_1,i_1)$ and $(n_1,j_1)$ are defined to be:

$$res(n_1,i_1) = \Delta(n_1,i_1) - (\hat{\alpha}(n_1) + \hat{\beta}(n_1)i_1)$$

$$res(n_1,j_1) = \Delta(n_1,j_1) - (\hat{\alpha}(n_1) + \hat{\beta}(n_1)N - \hat{\beta}(n_1)j_1) \quad (19)$$

and the means square error is defined to be $$\text{mean squared error} = \quad (20)$$

$$\frac{1}{upper + lower} \left[ \sum_{l=0}^{upper} res^2(n_1, i_l) + \sum_{l=0}^{lower} res^2(n_1, j_l) \right]$$

To reduce the likelihood of false alarm (i.e. declaring non-ghosting pixels as ghosting ones), pixels for which the ratio between their residue and the mean squared error exceeds a predetermined. threshold "mse" are discarded.

The "-m" option sets the threshold "mse". Appropriate values for the "-m" option can range anywhere between 1 and 3. Clearly, if "mse" is too small, then most of the already detected ghosting pixels will be discarded for the second estimation process. On the other hand, if "mse" is too large, picels which have been misclassified as ghosting ones are not discarded and therefore result in large amounts of error in observations used for the linear least-squares estimation process. In most of the examples of the next section, the "-m" option is set to 2.

Another measure to improve the robustness of the algorithm is the -h option. Recall that the ghost detection part of the algorithm first checks the ratio between the magnitudes of even and odd parts of the pixel at location $(n_1,n_2)$. If this ration is close to 1 (or more specifically is in the range [1/eoratio, eoratio]) then either $Y(n_1,n_2)$ or $Y(n_1,(n_2+N/2) \bmod N)$ are classified as ghosting pixels. If the phase difference function is less than $\pi$ then the magnitude of the ghost (i.e. the ghosted pixel) is smaller than that of the object (i.e. the ghosting pixel). On the other hand, if the phase difference function is larger than $\pi$, the magnitude of the ghost becomes larger than that of the object causing it. Since we expect the phase difference function to be small (less than $\pi$) in the center of the magnet, the differentiation between ghosting and ghosted pixels is straightforward for the central columns of the image, and therefore there is not any ambiguity in computing the phase difference function. In fact, as we mentioned earlier, the "-t" option takes advantage of this in order to detect-/differentiate ghosting and ghosted pixels for the central 30 columns. Specifically, if the ratio shown in equation (17) is larger than the "eoratio" parameter set by the "-t" option, then $Y(n_1,n_2)$ is the ghosting pixel and $Y(n_1,n_2+N/2)$ is the ghosted pixel. On the other hand if the ratio of equation (17) is smaller than 1/eoratio, then $Y(n_1,n_2+N/2)$ is the ghosting and $Y(n_1,n_2)$ is the ghosted pixel. However, this clear distinction between ghosting and ghosted pixels is possible only if the phase difference function is known to be less than $\pi$, which in our situation corresponds to the central columns of the image. For columns away from the center, the phase difference function might become larger than $\pi$, thus creating an ambiguity about the ghosting and ghosted pixels. To resolve this ambiguity, the operator has to provide the algorithm with a clue as to whether or not the phase difference function is larger than $\pi$. Fortunately, this is a simple visual task since in the areas of image with large phase difference function (i.e. larger than $\pi$) the ghosts are brighter than the actual object causing the ghost. Therefore, if the ghost has larger intensity than the object in the areas to the left of central columns, "-h" option must be set to 1. Similarly, if the ghost has larger intensity than the object in the areas to the right of central columns, "-h" option must be set to 3. As shown below in most imaging situations, the ghost has lower intensity than the actual object itself, and thus there is no need to set the "-h" option to any value. However, in few of the heart images shown in FIGS. 4-11, the ghosts become larger than the objects and the "-h" option is needed to guide the program to correct them.

The "-d" option sets the internal double precision parameter "smooth" which smoothes the values of for neighboring columns. Specifically, if the value of for the $n_1$th column is different from those of the past four columns by more than an amount specified by "smooth", then $\alpha$ ($n_1$) and $\beta$ ($n_1$) are discarded and the $n_1$,th column appears unchanged in the output image. Appropriate values for "smooth" can range between 0.3 and 2. Clearly, if "-d" option is set to a small value, e.g. 0.3, then $\alpha$ and $\beta$ for most columns will be discarded and the final output will resemble the ghosted input image to a great extent. On the other hand, if "-d" option is set to a large value like 2, then the amount of smoothing is minimized, and the final image might have some columns which stand out amont their neighboring columns because of their drastically, different values of $\alpha$ and $\beta$.

The "-b" option sets the internal double precision parameter "betasmth" which smoothes the values of $\beta$ for neighboring columns. The functional description of this variable is similar to that of the "-d" option. Appropriate values for "betasmth" however, can range between 0.01 and 1.

The "-f" flag determines whether or not the processed ghost-free image needs to be rearranged so that the center of the magnet coincides with the center of the image. This flag is set for all the examples shown in the next section.

The "-a" option sets the internal double variable "scale" which scales the processed image before it is written in the output file. This parameter is normally set anywhere between 500 and 1000.

The "-e" option sets the internal variable "expand" which expands the final output image by an integer in each direction. The expansion is basically done by repeating each pixel a fixed number of times in x and y directions.

The "-c" flag determines whether the processed image is written in binary or hexadecimal format. The hexadecimal format is necessary for generating halftone images with PostScript commands and the Apple LaserWriter.

"Inputfile" denotes the name of the input file which contains the ASCII characters representing the time raw data or its two-dimensional inverse Fourier transform. If such an input file does not exist, the program exists while printing "input file does not exist".

"Outputfile" denotes the name of the output file which contains numbers between 0 and 255 representing the processed image. The format of these numbers is either in binary or hexadecimal depending on whether or not the "-c" flag is set.

Examples of images processed by the ghost elimination algorithm are shown in FIGS. 4-10. For each example, the ghosted image, the processed ghost-free image, and the parameters used with the algorithm will be shown.

Figure 4A:
FIGS. 4a-11b show before/after examples of NMR images processed with the algorithm of the present invention.

FIG. 4a shows a ghosted heart image which was processed by the ghost elimination algorithm with the following parameters:

```
correct -g -t100. -r1.5 -s5. -m3. -h1 -f -d2. -b1. -a1000
   -e4 htnum htproc
```

Figure 4B:

The processed ghost-free version is shown in FIG. 4b. Clearly, the AGC algorithm has done an excellent job of removing the ghosts. As it is seen, the magnitude of the ghost in the left side of FIG. 4a is larger than that of the object causing it. Therefore, the parameter "-h" had to be set at 1 in order to remove the ambiguity in the phase difference function for the columns to the left of the image.

Figure 5A:
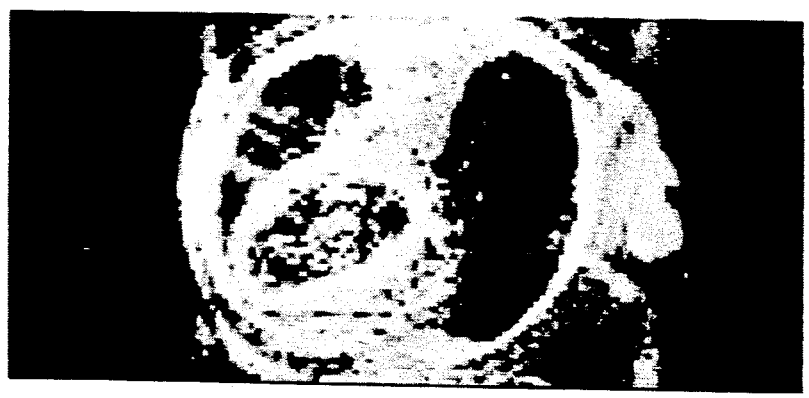
Figure 5B:
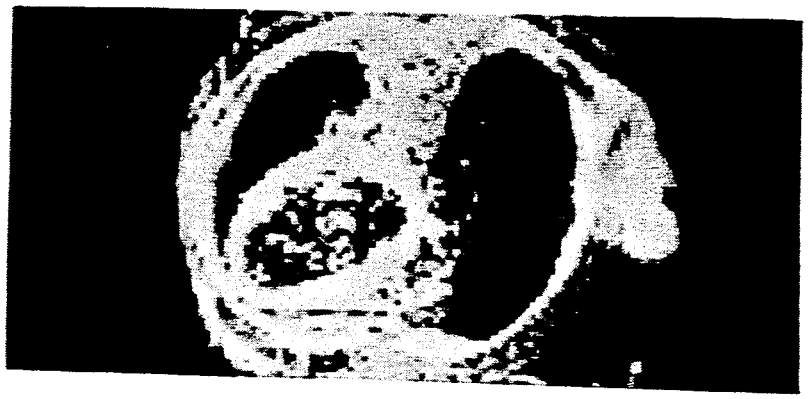

The second example of the ghost elimination algorithm is shown in FIG. 5. The original ghosted heart image is shown in FIG. 5a, and its processed ghost-free version is shown in FIG. 5b. The parameters of the algorithm were:

```
correct -g -t100. -r1.5 -s5. -m2. -f -d1. -b.05 -a1000 -e4
   heart5num heart5proc
```

Figure 6A:
Figure 6B:

A third example of the algorithm is shown in FIG. 6a, and its processed ghost-free version is shown in FIG. 6b. The parameters of the algorithm were:

correct -g -t100. -r1.5 -s5. -m2. -f -d2. -b.1 -h1 -a750
        -e4 heart4num heart4proc Similar to FIG. 4a, the magnitude of the ghost in the left side of FIG. 6a is larger than that of the object causing it. Thus, "-h" option had to be set to 1, to remove the ambiguity of the phase difference function for the columns to the left of the ghosted image.

Figure 7A:
Figure 7B:

A fourth example of the algorithm is shown in FIG. 7. The original ghosted heart image is shown in FIG. 7a, and its processed ghost-free version is shown in FIG. 7b. The parameters of the algorithm were:

correct -g -t100. -r1.5 -s5. -m2. -f -d.7 -b.03 -h3 -a500
        -e4 heart3num heart3proc As it is seen in FIG. 7a, the magnitude of the ghost in the right and left part of the ghosted image is slightly larger than that of the object causing it. Therefore, the "-h" option is set at 3, to remove the ambiguity associated with the phase difference function.

Figure 8A:
Figure 8B:

A fifth example of the algorithm is shown in FIG. 8. The original ghosted heart image is shown in FIG. 8a, and its processed ghost-free version is shown in FIG. 8b. The parameters of the algorithm were:

correct -t10. -r1.3 -s200000000. -m2. -f -d.5 -b1. -a1000
        -e4 newhtnum newhtproc Note that in the above example, the input file contained the 2-D inverse Fourier transform of the raw time date. Therefore, the "-s" option had to be set at a different value from the previous examples.

Figure 9A:
Figure 9B:

A sixth example of the algorithm is shown in FIG. 9. The original ghosted heart image is shown in FIG. 9a, and its processed ghost-free version is shown in FIG. 9b. The parameters of the algorithm were:

correct -g -t1. -r1.5 -s5. -m3. -f -d.6 -b.06 -a1000 e4
        lvrnum lvrproc

Figure 10A:
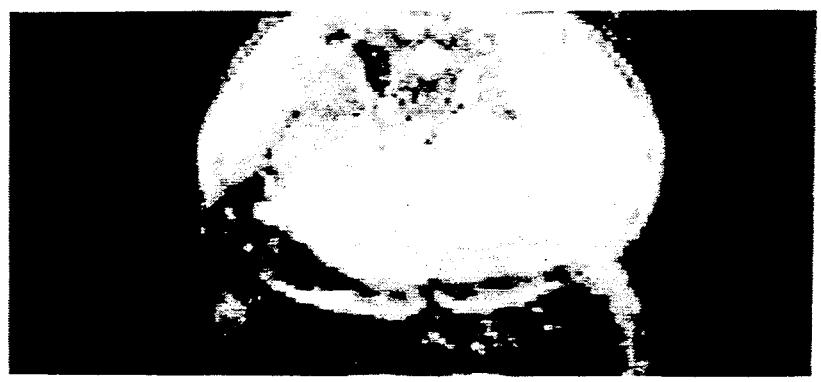
Figure 10B:
Figure 11A:
Figure 11B:

A seventh example of the algorithm is shown in FIG. 10. The original ghosted heart image is shown in FIG. 10a, and its processed ghost-free version is shown in FIG. 10b. The parameters of the algorithm were:

correct -g -t100. -r1.5 -s5. -m2. -f -d1. -b.1 -a1000 -e4
        body2num body2proc An eighth example of the algorithm is shown in FIG. 11. The original ghosted heart image is shown in FIG. 11a, and its processed ghost-free version is shown in FIG. 11b. The parameters of the algorithm were:

correct -g -t100. -r1.5 -s5. -m3. -f -d.7 -b.06 -a1000 -e4
        body3num body3proc Although the present invention has been described in connection with a preferred embodiment thereof, many other variations and modifications will now become apparent to those skilled in the art without departing form the scope of the invention. It is preferred, therefore, that the present invention be limited not by the specific disclosure herein, but only by the appended claims Appendix A

A Program Listing for the AGC Algorithm

The following program is an implementation of the final version of the AGC algorithm. The listing of include file "vz.h" is in Appendix (C).

```
#include <stdio.h>
#include <math.h>
#include </home/joshua/fa/avz/lib/vz.h>
define pi 3.14159265358979323846 double x[34000],yr[129][129],yi[129][129],z[257],data[128],weight[128];
unsigned char pic[64][128],pic2[256][512];
dcomplex c[128],raw[128];
int list[128];

/****************************************************************/
/* this programs is an implementation of the Automatic Ghost    */
/* Correction (AGC) algorithm which has been described in two   */
/* reports submitted to ANMR.                                   */
/****************************************************************/ main(argc,argv)
     int argc;
     char *argv[];
{ int i,j,k,l,N,narg,size,L,p,col,row,fd,logrow,count,flag,flag2,n;
   int expand,flag3,flag6,bothcol,befcol,bothflag6,flag7;
   FILE *fp,*fopen(),*fp2;
```

```
double tmp1,tmp2,tmp3,max,min,diff,tmp,epsilon,delta,tmp4,tmp5,tmp6,tmp7;
double tmp8,tmp9,tmp10,tmp11,a00,a01,a11,d0,d1,det,alpha,beta,threshold;
double snr,msetol,scale,eoratio,threshold2,before,smooth,bothalpha,bothbeta;
double betasmth,arbeta[128],aralpha[128];
dcomplex tmpz1,tmpz2,even,odd;

msetol = 2.;
snr = 5.;
threshold = 300.;
flag = 0;
flag2 = 0;
expand = 1;
flag3 = 0;
scale = 255.;
eoratio = 1.1;
smooth = .7;
betasmth = .03;
flag7 = 0;

if ( argc != 1 ){
    for (i = 1 ; argv[i][0] == '-' ; i++ ){
        switch ( argv[i][1])    {
        case 't' :      sscanf(&argv[i][2],"%lf",&threshold);
            break;
        case 's' :      sscanf(&argv[i][2],"%lf",&snr);
            break;
        case 'm' :      sscanf(&argv[i][2],"%lf",&msetol);
            break;
        case 'a' :      sscanf(&argv[i][2],"%lf",&scale);
            break;
        case 'r' :      sscanf(&argv[i][2],"%lf",&eoratio);
            break;
        case 'd' :      sscanf(&argv[i][2],"%lf",&smooth);
            break;
        case 'b' :      sscanf(&argv[i][2],"%lf",&betasmth);
            break;
        case 'h' :      sscanf(&argv[i][2],"%d",&flag7);
            break;
        case 'g' :      flag2 = 1 ;
            break;
        case 'e' :      sscanf(&argv[i][2],"%d",&expand);
            break;
        case 'c' :      flag3 = 1 ;
            break;
        default:        printf("%c?\n",argv[i][1]);
        }
    }
}else{
    i = 1 ;
}
narg = i ;
if ( argc != narg + 2 ) {
    printf("usage: acor \n -g (if set will do inverse 2d fft) \n \
-t(ratio betweeen x(n) and x(n+N/2): must be large for central \
columns) \n -r(even to odd ratio: must be close to 1 for ghosting \
pixels) \n -d(parameter controlling smoothness of alpha corrections) \
\n -b ( parameter controlling smoothness of beta corrections) \n \
-s(snr: avoid processing columns with small signal component) \n\
-m(mse tolerance: discard pixels whose llsq mse is large) \n -h \
(ghost larger than image: 1 left, 2 right, 3 both) \n -f(rearrange \
so that center of magnet coincides with center of image) \n -a(scale \
to see the ghosts clearly) \n -e(expand by a factor of 2 in each\
direction) \n -c (convert to hexidecimal for halftone printout) \n \
inputfile \n outputfile \n");
    exit(1);
}
if ( (fp = fopen( argv[narg] , "r")) == NULL ){
    fprintf(stderr,"inputfile doesnot exist \n");
    exit(1);
```

```
            }
            for ( i = 1 ; p != EOF ; ++i ){
              p = fscanf(fp,"%lf ",&tmpl);
              x[i-1] = tmpl;
            }
            L = i - 2 ;
            fclose(fp);
            if ( flag2 == 1 ){
              /* rearrange */
              for ( i = 0; i < 64 ; ++i ){
                for ( j = 0 ; j < 128 ; ++j ){
                  yr[2*i][j]= x[j*64+i];
                  yr[2*i+1][j] = 0.;
                  yi[2*i][j] = x[8192+j*64+i];
                  yi[2*i+1][j] = 0.;
                }
              }
              row = 128;
              logrow = 7;
              for ( i = 0 ; i < 64 ; ++i ){
                for ( j = 0 ; j < 128 ; ++j ){
                  z[2*j] = yr[2*i][j];
                  z[2*j+1] = yi[2*i][j];
                }
                ifft05_(z,&logrow,&row);
                for ( j = 0 ; j < 128 ; ++j ){
                  yr[2*i][j] = z[2*j];
                  yi[2*i][j] = z[2*j+1];
                }
              }
              /* now do the other fft */
                z[2*((i+32)%64 ) + 1] = yi[2*i][j];
              }
              row = 64 ;
              logrow = 6;
              ifft05_(z,&logrow,&row);
              for ( i = 0 ; i < 64 ; ++i ){
                yr[2*i][j] = z[2*i];
                yr[2*i+1][j] = z[2*i+1];
              }
            }
          }else{
            for ( i = 0; i < 64 ; ++i ){
              for ( j = 0 ; j < 128 ; ++j ){
                yr[2*i][j]= x[j*64+i];
                yr[2*i+1][j] = x[8192+i+j*64];
              }
            }
          }
        }
        if ( flag2 == 0 ){
              /* rearrange */
              for ( i = 0 ; i < 64 ; ++i ){
                    for ( j = 0 ; j < 128 ; ++j ){
                        yi[i][j] = yr[i+64][j];
                        yi[i+64][j] = yr[i][j];
                    }
              }
              for ( j = 0 ; j < 64 ; ++j ){
                    for ( i = 0 ;i < 128 ; ++i ){
                        yr[i][j] = yi[i][j+64];
                        yr[i][j+64] = yi[i][j];
                    }
              }
        }
        before = 0.;
        flag6 = 2;
        bothflag6 = 2;
        for ( j = 0 ; j < 128 ; ++j ){
          alpha = 2000000.;
          beta = 2000000.;
          /* dum the raw data into complex array */
```

```c
for ( i = 0 ; i < 64 ; ++i ){
  raw[i] = dzcplx ( yr[2*i][j],yr[2*i+1][j]);
}
/* decide if you want to process this column or not */
tmp = 0.;
for ( i = 0 ; i < 64 ; ++i ){
  if ( dzmag2(raw[i]) > tmp ){
    tmp = dzmag2(raw[i]);
  }
}
if ( tmp < snr ){
  for ( i =0 ; i < 64 ; ++i ){
    c[i] = raw[i];
  }
  alpha = 2000000.;
  beta = 2000000.;
}else{
  /* intialize cr */
  for ( i = 0 ; i < 64 ; ++i ){
    c[i] = dzcplx(2000000.,2000000.);
  }
  if ( ( j > 15 ) && ( j < 128-15 )){
    threshold2 = 1.;
  threshold2 = (threshold - 1.)*j/15. + 128./15. + (128. - 15.)*threshold/15
}
count = 0;
for ( i = 0 ; i < 32 ; ++i ){
  tmp = pow( dzmag2(raw[i])/dzmag2(raw[i+32]),2.);
  even = dzadd(raw[i],raw[i+32]);
  odd = dzsub(raw[i],raw[i+32]);
  tmp2 = dzmag2(even)/dzmag2(odd);
  if ( (tmp > threshold2) && ((tmp2 < eoratio ) && (tmp2 > 1./eoratio))){
    list[count] = i ;
    tmpz1 = dzadd(raw[i],raw[i+32]);
    tmpz2 = dzsub(raw[i],raw[i+32]);
    data[count] = atan2( tmpz1.di,tmpz1.dr) - atan2 (tmpz2.di,tmpz2.dr);
    while ( data[count] < -pi ){
      data[count] += (2.*pi);
    }
    while ( data[count] > pi ){
      data[count] -= (2.*pi);
    }
    /* use apriori information about phase */
    if ( ( (flag7 ==1) || (flag7 ==3)) && ( j > 64 ) && ( j < 128 -15 ))
    {
        if ( j < 128 - 30 )
        {
            tmp4 = 0.;
        }
        else
        {
            tmp4 = j*pi/120. - 98.*pi/120.;
        }
        if ( (data[count] > tmp4 ) && ( data[count] < pi - tmp4 ))
        {
            data[count] += pi;
            while ( data[count] < -pi ){
                data[count] += (2.*pi);
            }
            while ( data[count] > pi ){
                data[count] -= (2.*pi);
            }
        }
    }
    if ( ( (flag7 ==2) || (flag7 ==3)) && ( j > 15) && ( j < 64 ))
    {
        if ( j > 30 )
        {
            tmp4 = 0.;
        }
        else
        {
            tmp4 = j*pi/120. - pi/4.;
        }
```

```
                    if ( ( data[count] < tmp4) && ( data[count] > -pi -tmp4))
                    {
                            data[count] += pi;
                            while ( data[count] < -pi ){
                                    data[count] += (2.*pi);
                            }
                            while ( data[count] > pi ){
                                    data[count] -= (2.*pi);
                            }
                    }
            }
    tmpz1 = dzadd(raw[i],raw[i+32]);
    tmpz2 = dzsub(raw[i],raw[i+32]);
    data[count] = atan2( tmpz1.di,tmpz1.dr) - atan2 (tmpz2.di,tmpz2.dr) + pi.
    while ( data[count] < -pi ){
      data[count] += (2.*pi);
    }
    while ( data[count] > pi ){
      data[count] -= (2.*pi);
    }
    /* use aprior information about phase */
    if ( ((flag7 == 1 )|| (flag7 == 3)) &&( j > 64 ) && ( j < 128-15 ))
    {
            if ( j < 128 - 30 )
            {
                    tmp4 = 0.;
            }
            else
            {
                    tmp4 = j*pi/120. - 98*pi/120.;
            }
            if ( ( data[count] > tmp4 ) && ( data[count] < pi - tmp4))
            {
                    data[count] += pi;
                    while ( data[count] < -pi ){
                            data[count] += (2.*pi);
                    }
                    while ( data[count] > pi ){
                            data[count] -= (2.*pi);
                    }
            }
    }
    if ( ( (flag7 ==2) || (flag7 == 3)) &&( j > 15 ) && ( j < 64 ))
    {
            if ( j > 30 )
            {
                    tmp4 = 0.;
            }
            else
            {
                    tmp4 = j*pi/120. - pi/4.;
            }
            if ( (data[count] < tmp4 ) && ( data[count] > -pi -tmp4))
            {
                    data[count] -= pi;
                    while ( data[count] < -pi ){
                            data[count] += (2.*pi);
                    }
                    while ( data[count] > pi ){
                            data[count] -= (2.*pi);
                    }
            }
    }
    count++;
  }
}
/* build the matrix, but first make sure you have enough points */
if ( count < 5 ){
        for ( i = 0 ; i < 64 ; ++i ){
                c[i] = raw[i];
        }
        alpha = 2000000.;
        beta = 2000000.;
}else if ( count < 8 ){
```

```
        }
        alpha = alpha/count;
        beta = 0.;
        /* get rid of bad data */
        tmp = 0.;
        for ( i = 0 ; i < count ; ++i ){
                tmp += (pow( data[i] - alpha,2.));
        }
        tmp = tmp/count;
        for ( i = 0 ; i < count ; ++i ){
                if ( pow(data[i] - alpha,2.) > msetol*tmp ){
                        for ( k = i ; k < count ; ++k ){
                                list[k] = list[k+1];
                                data[k] = data[k+1];
                        }
                        count--;
                        i--;
                }
        }
        if ( count < 5 ){
                for ( i = 0 ; i < 64 ; ++i ){
                        c[i] = raw[i];
                }
                alpha = 2000000.;
                beta = 2000000.;
        }else{
                alpha = 0.;
                for ( i = 0 ; i < count ; ++i ){
                        alpha += data[i];
                }
                alpha = alpha/count;
                beta = 0.;
                tmp = 0.;
                for ( i = 0 ; i < count ; ++i ){
                        tmp += pow( alpha + beta*list[i] - data[i],2.);
                }
                tmp = tmp/((double)(count));  /* mean square error */
                if ( tmp > .5 ){
                        for ( i = 0 ; i < 64 ; ++i ){
                                c[i] = raw[i];
                        }
                        alpha = 2000000.;
                        beta = 2000000.;
                }
        }
}else{
        /* linear least square */
        a00 = count;
        a01 = 0.;
        for ( i = 0 ; i < count ; ++i ){
                a01 += list[i];
        }
        a11 = 0.;
        for ( i = 0 ; i < count ; ++i ){
                a11 += ( list[i]*list[i]);
        }
        d0 = 0.;
        for ( i = 0 ; i < count ; ++i ){
                d0 += data[i];
        }
        d1 = 0.;
        for ( i = 0 ; i < count ; ++i ){
                d1 += ( data[i]*list[i]);
        }
        beta = ( -a01*d0 + a00*d1)/det;
        /* first compute the mean square eror */
        tmp = 0.;
        for ( i = 0 ; i < count ; ++i ){
                tmp += pow( alpha + beta*list[i] - data[i],2.);
        }
        tmp = tmp/((double)(count)); /* mean square error */
        for ( i = 0 ; i < count ; ++i ){
                tmp2 = pow(alpha + beta*list[i]-data[i],2.);
```

```c
}
for ( i = 0 ; i < count ; ++i ){
        tmp2 = pow(alpha + beta*list[i]-data[i],2.);
        if ( tmp2 > msetol*tmp ){
                /* get rid of the bad point */
                for ( k = i ; k < count ; ++k ){
                        list[k] = list[k+1];
                        data[k] = data[k+1];
                }
                count--;
                i--;
        }
}
if ( count < 5 ){
        for ( i = 0 ; i < 64 ; ++i ){
                c[i] = raw[i];
        }
        alpha = 2000000.;
        beta = 2000000.;
}else if ( count < 8 ){
        alpha = 0.;
        for ( i = 0 ; i < count ; ++i ){
                alpha += data[i];
        }
        alpha = alpha/count;
        beta = 0.;
        tmp = 0.;
        for ( i = 0 ; i < count ; ++i ){
                tmp += pow( alpha + beta*list[i] - data[i],2.);
        }
        tmp = tmp/((double)(count)); /* mean square error */
        if ( tmp > .5){
                for ( i = 0 ; i < 64 ; ++i ){
                        c[i] = raw[i];
                }
                alpha = 2000000.;
                beta = 2000000.;
        }
}else{
        a00 = count;
        a01 = 0.;
        for ( i = 0 ; i < count ; ++i ){
                a01 += list[i];
        }
        a11 = 0.;
        for ( i = 0 ; i < count ; ++i ){
                a11 += ( list[i]*list[i]);
        }
        d0 = 0.;
        for ( i = 0 ; i < count ; ++i ){
                d0 += data[i];
        }
        d1 = 0.;
        for ( i = 0 ; i < count ; ++i ){
        alpha = ( a11*d0 - a01*d1)/det;
        beta = ( -a01*d0 + a00*d1)/det;
        tmp = 0.;
        for ( i = 0 ; i < count ; ++i ){
                tmp += pow( alpha + beta*list[i] - data[i],2.);
        }
        tmp = tmp/((double)(count)); /* mean square error */
        if ( tmp > .5){
                for ( i = 0 ; i < 64 ; ++i ){
                        c[i] = raw[i];
                }
                alpha = 2000000.;
                beta = 2000000.;
        }
        if ( fabs(beta) > .07 ){
                alpha = d0/((double)(count));
                beta = 0.;
        }
}
```

```
                }
        /* now do the smoothing */
        if ( (beta != 0.) && ( beta != 2000000.))
           {
                if ( ( (j < 64)&& ( bothflag6 == 0)) || ( ( j >= 64)
                    && (bothflag6 == 1 )))
                   {
                        if ( ((fabs( bothbeta - beta) > (betasmth*(j-bothcol
                            +5.)/6. ) ) || ( fabs (bothalpha - alpha ) >
                            (smooth*(j-bothcol+5.)/6. )) ) &&
                            ( ( j - bothcol) < 5 ))
                           {
                                beta = 2000000.;
                                alpha = 2000000.;
                                for ( i = 0 ; i < 64 ; ++i )
                                   {
                                        c[i] = raw[i];
                                   }
                           }
                   }
           }
        else if ( ( alpha != 2000000. ) && ( alpha != 0.))
           {
                if ( (( j < 64 ) && ( flag6 == 0 )) || ( (j>64)&&(flag6 == 1)))
                   {
                        if ( (fabs(alpha - before ) > (smooth*
                            (j-befcol+5.)/6.) ) && ( (j - befcol ) < 5 ))
                           {
                                alpha = 2000000.;
                                beta = 2000000.;
                                for ( i = 0 ; i < 64 ; ++i )
                                   {
                                        c[i] = raw[i];
                                   }
                           }
                   }
           }
        for ( i = 0 ; i < 32 ; ++i ){
                if ( (c[i].dr == 2000000.)|| (c[i+32].dr == 2000000.) ){
                        even = dzadd(raw[i],raw[i+32]);
                        odd = dzsub(raw[i],raw[i+32]);
                        c[i].dr = dzabs ( dzdiv ( dzadd ( even ,
                            dzmul (odd , dzexp ( 0., alpha
                            + beta*(32. - i )))) , tmpz1));
                        c[i].di = 0.;
                   }
                if ( c[i+32].dr == 2000000.){
                        c[i+32].dr = dzabs ( dzdiv ( dzsub ( even ,
                            dzmul (odd , dzexp ( 0., alpha
                            + beta*i))) , tmpz1));
                        c[i+32].di = 0.;
                   }
           }
   }
   /* put stuff back into y */
   for ( i = 0 ; i < 64 ; ++i ){
        yr[2*i][j] = c[i].dr;
        yr[2*i+1][j] = c[i].di;
   }
}
if ( (beta != 0.) && ( beta != 2000000.))
   {
        bothbeta = beta;
        bothalpha = alpha;
        if ( j < 64 )
           {
                bothflag6 = 0;
           }
        else
           {
                bothflag6 = 1;
```

```
                    }
                    bothcol = j;
            }
    else if( (alpha != 0.) && ( alpha != 2000000.))
            {
                    before = alpha;
                    if ( j < 64 )
                        {
                            flag6 = 0;
                        }
                    else
                        {
                            flag6 = 1;
                        }
                    befcol = j;
            }
    aralpha[j] = alpha;
    arbeta[j]  = beta;
  }
/* now interpolate between alphas and betas */
for ( i = 1 ; i < 127 ; ++i )
  {
        if ( (aralpha [i] == 2000000.) && ( aralpha[i+1] != 2000000.)
             && ( aralpha[i-1] != 2000000.))
            {
                    if ( (arbeta[i+1] != 0)&& (arbeta[i+1] != 2000000.)
                         && (arbeta[i-1] != 0 ) && ( arbeta[i-1] != 2000000.))
                        {
                            arbeta[i]  = (arbeta[i+1] + arbeta[i-1])/2.;
                            aralpha[i] = (aralpha[i+1] + aralpha[i-1])/2.;
                        }
                    else if ( ( (arbeta[i+1] == 2000000.) ||
                            arbeta[i]  = 0.;
                            aralpha[i] = (aralpha[i+1] + aralpha[i-1])/2.;
                        }
                    alpha = aralpha[i];
                    beta  = arbeta[i];
                    if ( aralpha[i] != 2000000.)
                        {
                            /* dump things into raw */
                            for ( k = 0 ; k < 64 ; ++k ){
                                    raw[k] = dzcplx ( yr[2*k][i],yr[2*k+1][i]).
                            }
                            for ( k = 0 ; k < 32 ; ++k )
                                {
                                    even = dzadd(raw[k],raw[k+32]);
                                    odd  = dzsub(raw[k],raw[k+32]);
                                    tmpz1 = dzadd( dzexp (0., alpha
                              + beta*k) , dzexp ( 0., alpha + beta*(32-k)));
                                    yr[2*k][i] = dzabs ( dzdiv ( dzadd
( even , dzmul (odd , dzexp ( 0., alpha + beta*(32. - k )))) , tmpz1));
                                    yr[2*k+1][i] = 0.;
                                    yr[2*(k+32)][i] = dzabs ( dzdiv
( dzsub ( even , dzmul (odd , dzexp ( 0., alpha + beta*k))) , tmpz1));
                                    yr[2*(k+32)+1][i] = 0.;
                                }
                        }
            }
  }
/* out put */
min = 0.;
if ( flag2 == 1 ){
        max = 27.;
}else{
        max = 200000.;
}
for ( i = 0 ; i < 64 ; ++i ){
        for ( j = 0 ; j < 128 ; ++j ){
                tmp = sqrt(yr[2*i][j]*yr[2*i][j] + yr[2*i+1][j]*yr[2*i+1][j]);
                yi[i][j] = scale*( tmp - min)/(max-min);
```

```
                ~if (yi[i][j] > 255.){
                        yi[i][j] = 255.;
                }
                pic[i][j] = yi[i][j];
        }
        if ( flag == 1 ){
                /* rearrange */
                for ( i = 0 ; i < 32 ; ++i ){
                        for ( j = 0 ; j < 128 ; ++j ){
                                pic2[i][j] = pic[i+32][j];
                                pic2[i+32][j] = pic[i][j];
                        }
                }
                for ( j = 0 ; j < 64 ; ++j ){
                        for ( i = 0 ;i < 64 ; ++i ){
                                pic[i][j] = pic2[i][j+64];
                                pic[i][j+64] = pic2[i][j];
                        }
                }
        }
        fp = fopen(argv[narg+1],"w");
        /*  fd = fileno(fp); */
        if ( flag3 == 1 ){
                for ( i = 0 ; i < 64 ; ++i ){
                }
        }else{
                fd = fileno(fp);
                for ( i = 0 ; i < 64*expand ; ++i ){
                        for ( j = 0 ; j < 128*expand ; ++j ){
                                pic2[i][j] = pic[i/expand][j/expand];
                        }
                }
                for ( i = 0 ; i < 64*expand ; ++i ){
                        write(fd,pic2[i],128*expand);
                }
        }
        fclose(fp);
}
```

Appendix B

B  Program Listing for the ifft05 Subroutine

The following subroutine takes inverse FFT of the one dimensional double precision array $x$. Length of $x$ is specified by $len$, and $pow$ is defined to be $\log_2 len$.

```
#include <math.h>
include <stdio.h> ifft05_(x,pow,len)
double *x;
long *pow,*len;
{
        double wr,wi,arg;
        int length,power,length2;

length= *len;
        power= *pow;
        length2 = length*2;

/* bit reverse */
        {
                register int i,mask,j;
                register double *p1,*p2,t;

for (i=0,p1=x; i<length2; i++) *p1++ /= length;
                for (i=2; i<length2-2; i+=2) {
```

```
                for (mask=2, j=0; mask<length2; mask<<=1) {
                        if (i & mask) j++;
                        j <<= 1;
                }
                if (i<j) {
                        p1 = x+i;
                        p2 = x+j;
                        t = *p1;
                        *(p1++) = *p2;
                        *(p2++) = t;
                        t = *p1;
                        *p1 = *p2;
                        *p2 = t;
                }
        }
}
{
        register double tr,ti,ur,ui;
        register int le,i;
        register double *plr,*pli,*p2r,*p2i;
        int j,l,le2;

le=2;
        for (l=0; l<power; l++) {
                le <<= 1;
                le2 = le>>1;
                ur=1.0;
                ui=0.0;
                arg = 3.141592653589793 / (le2>>1);
                wr=cos(arg);
                wi= sin(arg);
                for (j=0; j<le2; j+=2) {
                        plr = x+j;
                        pli = plr+1;
                        p2r = plr+le2;
                        p2i = p2r+1;
                        for (i=j; i<length2; i+=le) {
                                tr = *p2r * ur - *p2i * ui;
                                ti = *p2r * ui + *p2i * ur;
                                *p2r = *plr - tr;
                                *p2i = *pli - ti;

p2r += le;
                                p2i += le;
                        }
                        tr = ur*wr - ui*wi;
                        ui = ur*wi + ui*wr;
                        ur = tr;
                }
        }
}
```

Appendix C

C  Listing of the Include File "vz.h"

The following is the listing of "vz.h" include file which is used in "correct.c" program for complex number calculations.

```
#ifndef _VZ_
#define _VZ_

/* This is an include file for the correct.c program.
   It defines the data types "complex" and "dcomplex" as appropriate
   structs, and also declares the type of all the "z", "dz", "v", "dv",
   "zv", and "zdv" routines.
*/
```

```
typedef struct { float r, i ; } complex ;

typedef struct { double dr, di ; } dcomplex ;

/* Complex Routines (z,dz) */ complex zadd(),zsub(),zmul(),zdiv(),zcnjg(),zcplx() ;
complex zexp(),zlog(),zcos(),zsin(),zsqrt(),zscal() ;
complex zpolr(),zrect() ;
dcomplex ztodz() ;
double zabs(),zmag2(),zmse() ;
int zcmp() ;

dcomplex dzadd(),dzsub(),dzmul(),dzdiv(),dzcnjg(),dzcplx() ;
dcomplex dzexp(),dzlog(),dzcos(),dzsin(),dzsqrt(),dzscal() ;
dcomplex dzpolr(),dzrect() ;
complex dztoz() ;
double dzabs(),dzmag2(),dzmse() ;
int dzcmp() ;

/* Vector Arithmetic Package (v,dv) */ int vclip(),*vtoint() ;
double vcor(),vconv(),vmse(),vsum(),vmnmx() ;
float *vadd(),*vclr(),*vscal(),*vmove(),*vmul(),*vdiv() ;
float *vabs(),*vcos(),*vsin(),*vexp(),*vlog(),*vsqrt() ;
float *vrev(),*vmag2() ;
double *vtodv() ;
complex *vtozv() ;
dcomplex *vtodzv() ;

int dvclip(),*dvtoint() ;
double dvcor(),dvconv(),dvmse(),dvsum(),dvmnmx() ;
double *dvadd(),*dvclr(),*dvscal(),*dvmove(),*dvmul(),*dvdiv() ;
double *dvabs(),*dvcos(),*dvsin(),*dvexp(),*dvlog(),*dvsqrt() ;
double *dvrev(),*dvmag2() ;
float *dvtov() ;
complex *dvtozv() ;
dcomplex *dvtodzv() ;

/* Complex Vector Package (zv, dzv) */ complex *zvadd(),*zvclr(),*zvcnjg(),*zvcos() ;
complex *zvcplx(),*zvdiv(),*zvexp(),*zvlog() ;
complex *zvmove(),*zvmul(),*zvmulc(),*zvpolr() ;
complex *zvrect(),*zvrev(),*zvscal(),*zvsin(),*zvsqrt() ;
complex *zvtori() ;
dcomplex *zvtodzv() ;
complex zvcor(),zvconv(),zvsum() ;
double zvmnmx(),zvmse() ;
float *zvabs(),*zvmag2() ;
int zvclip() ;
dcomplex *dzvrect(),*dzvrev(),*dzvscal(),*dzvsin(),*dzvsqrt() ;
dcomplex *dzvtori() ;
complex *dzvtozv() ;
dcomplex dzvcor(),dzvconv(),dzvsum() ;
double dzvmnmx(),dzvmse() ;
double *dzvabs(),*dzvmag2() ;
int dzvclip() ;

#endif
```

What is claimed is:

1. A method of cancelling ghosts from NMR images, comprising the steps of:
(a) taking a two dimensional inverse Fourier transform of a raw NMR signal to obtain a ghosted image $Y(n_1,n_2)$;
(b) computing the signal energy for each column of said Fourier transformed signal using $$E(n_1) = \sum_{n_2=0}^{N-1} |Y(n_1, n_2)|^2$$

(c) discarding the columns whose signal energy level are below a predetermined threshold;

(d) estimating $\alpha\ (n_1)$ and $\beta\ (n_1)$ for each remaining column of data; i.e. $n_1=0, \ldots N_s-1$, by:
 (i) finding the phase difference function $\Delta\ (n_1,n_2)$ for all ghosting pixels of the column; and
 (ii) solving the following simultaneous equations to find linear least square estimates of $\alpha\ (n_1)$ and $\beta\ (n_1)$:

$$\Delta(n_1, n_2) = \begin{cases} \alpha(n_1) + \beta(n_1) n_2 & 0 \leq n_2 \leq \frac{N}{2} \\ \alpha(n_1) + \beta(n_1)N - \beta(n_1) n_2 & \frac{N}{2} \leq n_2 < N \end{cases} \quad (12)$$

(e) using $\alpha(n_1)$ and $\beta(n_1)$ in the above equation to find the phase difference $\Delta(n_1, n_2)$ for $0 \leq n_2 < N$; and (f) using $\Delta(n_1, n_2)$ in $$Y_{even}(n_1, n_2) = A(n_1, n_2)e^{j\Delta(n_1,n_2)} + B(n_1, n_2)e^{j\Delta(n_1,n_2+\frac{N}{2})}$$

$$Y_{odd}(n_1, n_2) = A(n_1, n_2) - B(n_1, n_2)$$

to find $A(n_1,n_2)$ and $B(n_1,n_2)$ for $0 \leq n_2 < N$, where the dimensions of the reconstructed image are $N \times N_s$.

2. The method of claim 1, wherein the ratio of the magnitude of even and odd parts of a pixel at location $(n_1, n_2)$ is used to determine whether a pixel is a true image or a ghost.

3. The method of claim 2, wherein the pixel is classified as a ghost if said ratio is approximately equal to one.

4. The method of claim 2, wherein the following ratio $$\frac{|Y(n_1, n_2)|}{|Y(n_1, n_2 + N/2)|}$$

is computed, indicating that a pixel near the center of the magnetic cord is a ghost when the ratio extends to a predetermined value.

5. The method of claim 1, wherein columns with small signal components are not processed.

6. The method of claim 1, wherein pixels at location $(n_1, n_2)$ whose linear base squares mean square error is larger than a predetermined amount are discarded when determining the phase difference function.

* * * * *